(12) United States Patent
Minamitani et al.

(10) Patent No.: US 7,624,789 B2
(45) Date of Patent: Dec. 1, 2009

(54) LIQUID COOLING SYSTEM AND AN ELECTRONIC APPARATUS HAVING THE SAME THEREIN

(75) Inventors: Rintaro Minamitani, Tsukuba (JP); Shigeo Ohashi, Tsuchiura (JP); Takashi Naganawa, Chiyoda (JP); Shinji Matsushita, Chigasaki (JP); Hironori Oikawa, Hadano (JP)

(73) Assignee: Hitachi, Ltd., Tokyo (JP)

( * ) Notice: Subject to any disclaimer, the term of this patent is extended or adjusted under 35 U.S.C. 154(b) by 584 days.

(21) Appl. No.: 11/023,431

(22) Filed: Dec. 29, 2004

(65) Prior Publication Data

US 2005/0178533 A1 Aug. 18, 2005

(30) Foreign Application Priority Data

Feb. 16, 2004 (JP) ............... 2004-038180

(51) Int. Cl.
*F28D 15/00* (2006.01)
*F28F 7/00* (2006.01)
*H05K 7/20* (2006.01)

(52) U.S. Cl. ............... 165/104.33; 165/80.4; 165/46
(58) Field of Classification Search ............ 165/104.33, 165/108, 169, 170, 83, 80.4, 46; 361/699, 361/704; 257/714
See application file for complete search history.

(56) References Cited

U.S. PATENT DOCUMENTS

| | | | | |
|---|---|---|---|---|
| 3,327,776 A | * | 6/1967 | Butt | 165/80.4 |
| 4,155,402 A | * | 5/1979 | Just | 165/46 |
| 5,132,873 A | * | 7/1992 | Nelson et al. | 361/701 |
| 5,205,348 A | * | 4/1993 | Tousignant et al. | 165/46 |
| 5,245,693 A | * | 9/1993 | Ford et al. | 392/470 |
| 5,381,510 A | * | 1/1995 | Ford et al. | 392/470 |
| 5,535,818 A | | 7/1996 | Fujisaki et al. | |
| 5,720,338 A | | 2/1998 | Larson et al. | |
| 5,731,954 A | * | 3/1998 | Cheon | 361/699 |
| 6,115,252 A | * | 9/2000 | Ohta et al. | 361/700 |
| 6,397,932 B1 | * | 6/2002 | Calaman et al. | 165/80.4 |
| 6,563,709 B2 | * | 5/2003 | Negishi et al. | 361/699 |
| 6,808,015 B2 | * | 10/2004 | Osakabe | 165/104.25 |
| 2003/0011983 A1 | | 1/2003 | Chu et al. | |
| 2003/0151892 A1 | | 8/2003 | Kondo et al. | |
| 2003/0161100 A1 | | 8/2003 | Kondo et al. | |
| 2003/0214783 A1 | | 11/2003 | Narakino et al. | |
| 2004/0008485 A1 | | 1/2004 | Naganawa et al. | |

FOREIGN PATENT DOCUMENTS

JP 2001-237582 8/2001

* cited by examiner

*Primary Examiner*—Tho V Duong
(74) *Attorney, Agent, or Firm*—Antonelli, Terry, Stout & Kraus, LLP.

(57) ABSTRACT

In a liquid cooling system, comprising: a heat-receiving jacket for receiving heat from a heat-generation body therein; a heat-radiator for radiating the heat therefrom, which is received within the heat-receiving jacket; and a tank for accumulating refrigerant therein, which is connected with the heat-receiving jacket and the heat-radiator through flow passages, thereby enclosing a refrigerant within the heat-receiving jacket, the heat-radiator and the tank, including the flow passages provided therebetween, and further comprising: a liquid transfer means for generating a circulation flow of the refrigerant enclosed therein, wherein the tank is built up on one side surface of a substrate having superior heat-conductivity and heat-resistance, defined between a flexible film or sheet having superior heat-conductivity and heat-resistance, and the heat-radiator having a heat-radiation flow passage on the other side surface thereof, defined between the flexible film or sheet having superior heat-conductivity and heat-resistance.

2 Claims, 9 Drawing Sheets

LIQUID COOLING SYSTEM AND AN ELECTRONIC APPARATUS HAVING THE SAME THEREIN

BACKGROUND OF THE INVENTION

The present invention relates to a liquid cooling system for the purpose of cooling a heat-generating body, and it relates to, in particular, a liquid cooling system being suitable for an ultra-small and/or thin structure and an electronic apparatus applying the same therein, such as, a personal computer, etc., for example.

In the conventional art, as is already known in Japanese Patent Laying-Open No. 2001-237582 (2001) (Patent Document 1), for example, it is described therein, that a plane-like bag made from a flexible sheet is used to be the heat-radiation body, which has high heat-resistance and superior heat-conductivity, in particular, aiming an electronic apparatus equipped with a liquid crystal display. Further, it is also described that the heat-radiation body made from such the bag has a flow passage for refrigerant, which is formed with provision of plural numbers of partitions therein, being nearly in parallel with an outer periphery portion thereof, and that it has also an inlet/outlet for refrigerant on the outer periphery portion thereof, protruding in the direction in parallel with the plane-like surface of the bag.

Patent Document 1: Japanese Patent Laying-Open No. 2001-237582 (2001)

In such the Patent Document 1 as mentioned above, however sufficient consideration is not paid thereon, in particular, from a viewpoint, such as, about thin-sizing of the heat-radiation body and/or a tank, and about lowing a cost and high reliability thereof.

BRIEF SUMMARY OF THE INVENTION

Therefore, an object according to the present invention is to provide a liquid cooling system, having a heat-radiation body and/or a tank, for achieving the low cost and high reliability, and also an electronic apparatus, comprising such the liquid cooling system therein.

For accomplishing the object mentioned above, according to the present invention, there is provided a liquid cooling system, comprising: a heat-receiving jacket for receiving heat therein; a heat-radiation body for radiating the heat therefrom, which is received within said heat-receiving jacket; and a tank for accumulating refrigerant therein, which is connected with said heat-receiving jacket and said heat-radiator through flow passages, thereby enclosing a refrigerant within said heat-receiving jacket, said heat-radiation body and said tank, including said flow passages provided therebetween, and further comprising: a liquid transfer means for generating a circulation flow of the refrigerant enclosed therein, wherein said tank is built up with provision of either one of a flow passage and a space for accumulating said refrigerant therein, between a substrate and a flexible film or sheet to be jointed with each other.

Also, for accomplishing the object mentioned above, according to the present invention, there is provided a liquid cooling system, comprising: a heat-receiving jacket for receiving heat therein; a heat-radiation body for radiating the heat therefrom, which is received within said heat-receiving jacket; and a tank for accumulating refrigerant therein, which is connected with said heat-receiving jacket and said heat-radiator through flow passages, thereby enclosing a refrigerant within said heat-receiving jacket, said heat-radiation body and said tank, including said flow passages provided therebetween, and further comprising: a liquid transfer means for generating a circulation flow of the refrigerant enclosed therein, wherein said heat-radiation body is built up with provision of a heat-radiation flow passage for the refrigerant to flow-in from an inlet portion thereof, between a substrate and a flexible film or sheet to be jointed with each other.

Further, according to the present invention, for accomplishing the object mentioned above, there is further provided a liquid cooling system, comprising: a heat-receiving jacket for receiving heat therein; a heat-radiation body for radiating the heat therefrom, which is received within said heat-receiving jacket; and a tank for accumulating refrigerant therein, which is connected with said heat-receiving jacket and said heat-radiator through flow passages, thereby enclosing a refrigerant within said heat-receiving jacket, said heat-radiation body and said tank, including said flow passages provided therebetween, and further comprising: a liquid transfer means for generating a circulation flow of the refrigerant enclosed therein, wherein said heat-radiation body is built up with provision of a heat-radiation flow passage for the refrigerant to flow-in from an inlet portion thereof, between a substrate and a flexible film or sheet to be jointed with each other, also said tank, being connected with said heat-radiation flow passage, built up with provision of either one of a flow passage and a space for accumulating said refrigerant therein, between said substrate and other flexible film or sheet to be jointed with each other, and further an exit portion for said refrigerant to flow-out is provided at a predetermined position on either said heat-radiation flow passage or said tank, being connected therewith.

Also, according to the present invention, in the liquid cooling system as described in the above, preferably, said heat-radiation flow passage, as being said heat-radiation body, is defined between one side surface of said substrate and said flexible film or sheet to be jointed onto said one side surface thereof, while said flow passage and said space, as being said tank, for accumulating said refrigerant therein, between other side surface of said substrate and said flexible film or sheet to be jointed onto said other side surface thereof, or said heat-radiation flow passage, as being said heat-radiation body, is defined between one side surface of said substrate and said flexible film or sheet to be jointed onto said one side surface thereof, and further said flow passage and said space, as being said tank, for accumulating said refrigerant therein, between said flexible film or sheet jointed onto said one side surface thereof and a flexible film or sheet to be jointed thereon, upon said same one side surface of said substrate.

And, also according to the present invention, in the liquid cooling system as described in the above, preferably, said flexible film or sheet has structure of laminating layers, and at least one layer thereof is made of a material of liquid-impermeable characteristic, or said flexible film or sheet has structure of laminating layers, and at least one layer thereof is made of a material having chemical non-reactivity upon said refrigerant, or said flexible film or sheet has structure of laminating layers, and at least a layer at most inner-side surface thereof is made of a resin material having thermal plasticity.

Furthermore, according to the present invention, for accomplishing the object mentioned above, there is further provided a liquid cooling system, comprising: a heat-receiving jacket for receiving heat therein; a heat-radiation body for radiating therefrom the heat received within said heat-receiving jacket, being connected with said heat-receiving jacket through flow passages provided therebetween, thereby enclosing a refrigerant within said heat-receiving jacket and said heat-radiation body; and a liquid transfer means for generating a circulation flow of the refrigerant enclosed therein, wherein said heat-radiation body is built up with a first heat-radiation body, which is provided with a first heat-radiation flow passage for letting said refrigerant flow therein running into from an inlet portion thereof, defined by jointing a flexible film or sheet onto one side surface of a substrate, and a second heat-radiation body, which is provided with a second heat-radiation flow passage for letting said refrigerant flow therein, being connected with said first heat-radiation flow passage, by jointing a flexible film or sheet onto other side surface of said substrate, and further an exit portion for said refrigerant to flow-out is provided at a predetermined position on either said first heat-radiation flow passage or said second heat-radiation flow passage, being connected therewith.

Also, according to the present invention, for accomplishing the object mentioned above, there is further provided a liquid cooling system, comprising: a heat-receiving jacket for receiving heat therein; a heat-radiation body for radiating therefrom the heat received within said heat-receiving jacket, being connected with said heat-receiving jacket through flow passages provided therebetween, thereby enclosing a refrigerant within said heat-receiving jacket and said heat-radiation body; and a liquid transfer means for generating a circulation flow of the refrigerant enclosed therein, wherein said heat-radiation body is built up with a first heat-radiation body, which is provided with a first heat-radiation flow passage for letting said refrigerant flow therein running into from an inlet portion thereof, defined by jointing a flexible film or sheet onto one side surface of a substrate, and a second heat-radiation body, which is provided with a second heat-radiation flow passage for letting said refrigerant flow therein, being connected with said first heat-radiation flow passage, by jointing a flexible film or sheet onto said same one side surface of said substrate, and further an exit portion for said refrigerant to flow-out is provided at a predetermined position on either said first heat-radiation flow passage or said second heat-radiation flow passage, being connected therewith.

And, according to the present invention, in the liquid cooling system as described in the above, preferably, said first heat-radiation body and said second heat-radiation body are piled up, thereby building up said heat-radiation body, or said second heat-radiation body builds up a tank for accumulating said refrigerant therein.

BRIEF DESCRIPTION OF THE SEVERAL VIEWS OF THE DRAWING

Those and other objects, features and advantages of the present invention will become more readily apparent from the following detailed description when taken in conjunction with the accompanying drawings wherein.

DETAILED DESCRIPTION OF THE INVENTION

Hereinafter, a liquid cooling system and an electronic apparatus having the same therein, according to various embodiments of the present invention, will be fully explained by referring to the attached drawings.

Figure 1:
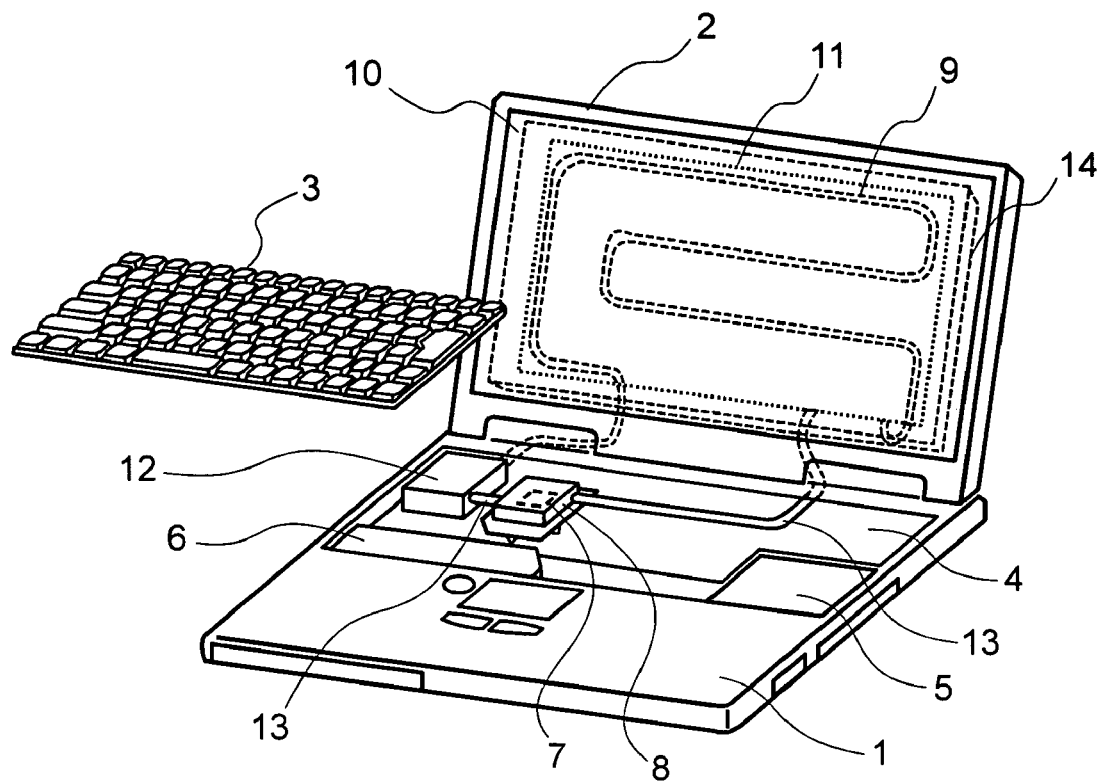
FIG. 1 is a perspective view for showing an electronic apparatus, according to one embodiment of the present invention.
Figure 2:
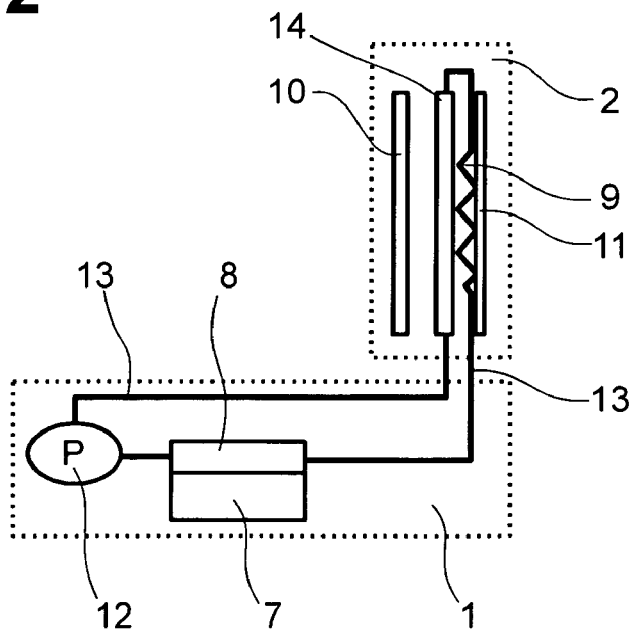
FIG. 2 is a block diagram for showing the electronic apparatus, according to the one embodiment of the present invention.

First, explanation will be made about an electronic apparatus, according to an embodiment of the present invention, by referring to FIGS. 1 and 2. The FIG. 1 is a perspective view for showing the electronic apparatus having the liquid cooling system therein, according to one embodiment of the present invention, and the FIG. 2 is a side cross-section view in FIG. 1 mentioned above. The electronic apparatus is built up, for example, with a main-body case 1 and a liquid-crystal display case 2 having a liquid crystal display 10 therein, wherein a keyboard 3, a printed wire board 4 installing plural numbers of semiconductor elements thereon, a hard disk drive 5, an auxiliary memory device 6 (for example, a disk drive, a CD drive, etc.) and so on are installed within the main-body case 1. However, for the purpose of explanation thereof, it is shown under the condition that the keyboard 3 is removed or detached therefrom. On the printed wire board 4 is installed a semiconductor element having a large amount of heat-radiation, in particular, such as, a CPU (i.e., a Central Processing Unit), for example. Onto this CPU 7 is attached a heat-receiving jacket 8. The CPU 7 and the heat-receiving jacket 8 are connected with each other through a soft heat-conductive material (for example, a material obtained by mixing heat-conductive fillers, such as, aluminum oxide or the like, into silicon (Si) grease). Also, on a reverse-side surface of the liquid-crystal display case 2 (but, within an inner side of the case), there is provided a heat-radiation body (or a heat-radiator), being made from a heat-radiation pipe 9 and a heat-radiation plate 11. Or, the liquid-crystal display case 2 may be made of a metal having high heat-conductivity (such as, an aluminum alloy, a magnesium alloy, etc., for example). And further, a pump 12 is provided within the main-body case 1, as being a liquid transfer means).

In the liquid cooling system according to the present invention, the heat-receiving jacket 8, the heat-radiating pipe 9 and the pump 12 are connected with one another through flexible tubes 13, and a coolant or refrigerant (such as, a water, or an anti-freezing liquid, etc.) enclosed within an inside thereof is circulated by the function of the pump 12, in the structure thereof. The heat generated in the CPU 7 is transmitted to the refrigerant flowing or conducting within the heat-receiving jacket 8, and then it is radiated into an outside air through surfaces of the heat-radiation plate 11, which is thermally connected with the heat-radiation pipe 9, and the liquid-crystal display case 2, during it passes through the heat-radiation pipe 9, which is provided in the reverse-side surface of the liquid-crystal display 10. With this, the refrigerant lowering the temperature thereof is sent out through the pump 12 into the heat-receiving jacket 8, again. Between the heat-radiator, being made up from heat-radiation pipe (i.e., heat-radiation passage) 9 and the heat-radiation plate 11, and the liquid-crystal display 10, there is provided the tank 14, while the tank 14 is filled up with the refrigerant therein (i.e., being accumulated). By the way, the heat-radiator, according to the present invention, includes the heat-radiation passage 9 and the heat-radiation plate 11 therein. And, the flexible film or sheet 16 is a part of the heat-radiation passage 9, and it is also a part of the heat-radiation plate 11. In this manner, the liquid-crystal display 10 is provided as being the display device, and also the above-mentioned heat-radiators 9 and 16 are provided, nearly in parallel with the liquid crystal display mentioned above. And, the tank 14 can be installed up to the sizes, to be nearly equal to those of the heat-radiation plate and the liquid crystal panel. Accordingly, in the present liquid cooling system, the tank (i.e., accumulating the refrigerant therein and also having a function of the second heat-radiation body) 14, the heat-radiation pipe (i.e., the first heat-radiation body) 9, the flexible tubes 13, the heat-receiving jacket 8 and the pump 12 constitute a circular closed circuit for the refrigerant, and the refrigerant is circulated through the operation of the pump 12. Further, as to the electronic apparatus having the liquid cooling system therein, it should not be restricted only to such the structures as was mentioned above, however there can be considered a personal computer and a server, and so on.

Figure 3:
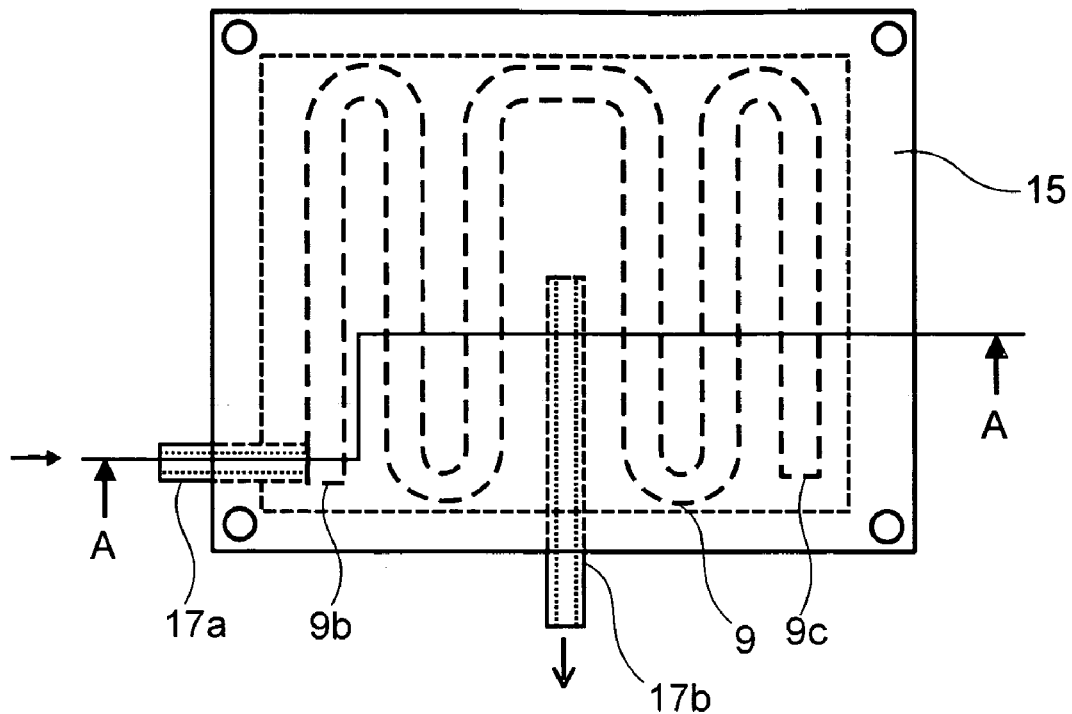
FIG. 3 is a front view for showing a tank/heat-radiator, being unified in one body in the structure, according to the one embodiment of the present invention.
Figure 4:
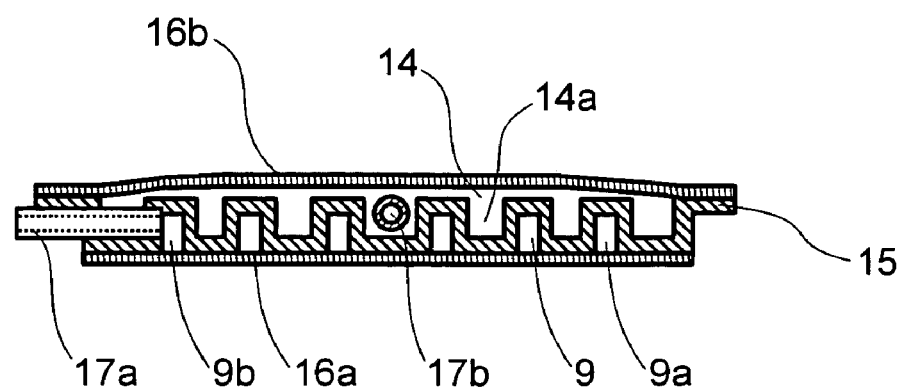
FIG. 4 shows the cross-section thereof, being cut along with a line indicated by arrows A-A in FIG. 3 mentioned above.

Next, explanation will be made about an embodiment of combining a tank (having the function as the second heat-radiation body, as well as, the function of accumulating the refrigerant therein) and the heat-radiator, which are applied within the liquid cooling system, according to the present invention, into a one body, as a unit. The tank and the heat-radiator, being combined into one body (i.e., a unified structure of tank/heat-radiator), build up the structure of unifying the functions of the heat-radiation pipe 9, the tank 14 and the heat-radiation plate 11, which are provided on the reverse-side surface of the liquid crystal display 10, within the electronic apparatus mentioned above, for example. FIG. 3 is a front view for showing an example of the combined or unified structure of the tank and the heat-radiator, FIG. 4 a cross-section view, being cut along the line indicted by arrows A-A in FIG. 3, FIG. 5 an explanatory view about an assembling method thereof, and FIG. 6 an enlarged cross-section view for showing the flexible film or sheet for forming the unified-structure of the tank/heat-radiator. The unified-structure of the tank/heat-radiator is built up with, from a viewpoint of the material thereof, a substrate 15 having preferable heat-conductivity and the heat-resistance (i.e., the preferable heat-conductivity means that it have the heat-conductivity, being nearly equal to or more than 50 W/(m/K), such as, the metals, Cu, Al, Ni, etc., for example, and the preferable heat-resistance means that it can stand up with the temperature, being nearly equal to or higher than the bonding temperature of the flexible film or sheet), being made of a metal, such as, Cu, Al, or the like, upon the surface of which is machined a recess structure through the extrusion, for example, and also the flexible films or sheets 16a and 16b having the preferable heat-conductivity and the heat-resistance (see the definition mentioned above). In FIG. 4, a flow passage (i.e., a space), which is defined between an upper-side recess portions 14a of the substrate 15 and the flexible film or sheet 16b, builds up the tank 14, and also a heat-radiation flow passage, which is defined between a lower-side recess portions 9a of the substrate 15 and the flexible film or sheet 16a, builds up that corresponding to the heat-radiation pipe 9. Further, the neighboring heat-radiation flow passages 9 are connected to each other, but so as to lie in a zigzag manner at the both end portions thereof. In particular, the upper-side recess portion 14a for use of a tank on the substrate 15 and the lower-side recess portions 9a for use of the heat-radiation pipe are formed, alternately, one by one; therefore, it is possible to achieve further thinning of the structure.

Also, a pipe-like inlet portion 17a for refrigerant is connected to an inlet 9b of the heat-radiation flow passage, as being the heat-radiation pipe. Further, an outlet 9c of the heat-radiation flow passage 9 is connected to the tank 14. And, at the central portion (i.e., a middle portion) of the tank 14 is connected a pipe-like outlet portion 17b for refrigerant. In this manner, the outlet portion 17b of the refrigerant is connected at the central portion of the tank 14, in the vertical direction and the horizontal direction thereof, and therefore, even if an air enters into an inside of the tank, but it is possible to prevent the air from flowing out through the outlet portion 17b. As was explained in the above, the tank 14 is made up between the upper-side recess portion 14a of the substrate 15 and the flexible film or sheet 16b, while the flow passage 9 as being the heat-radiation pipe between the lower-side recess portion 9a of the substrate 15 and the flexible film or sheet 16a, and further the outlet 9c of the flow passage 9 is connected to the tank 14; thereby, obtaining the unified structure of the tank/heat-radiator between the inlet portion 17a and the outlet portion 17b of the refrigerant.

By the way, in the water-cooling system mentioned above, an area of the air lies within the tank. And, accompanying with an increase of the water temperature, as being the refrigerant, the internal pressure goes up, due to an expansion of the air, an expansion of the liquid, and also due to evapor pressure of the liquid, and then, it reaches to the highest value, in particular, in the tank. For this reason, if the film or sheet of the tank has the flexibility, the internal pressure thereof can be decreased down through it. In this manner, the reason for letting the film or sheet 16 to have the flexibility lies to suppress or release the internal pressure of the tank.

Further, because of a plane defined on a lower surface of the heat-radiation flow passage, which is formed with the lower-side recess portion 9a of the substrate 15 and the flexible film or sheet 16a, it is possible to transfer the heat of the heat-radiators 15 and 16a into the housing or the case, which is in contact with the heat-radiator, effectively.

Figure 6:
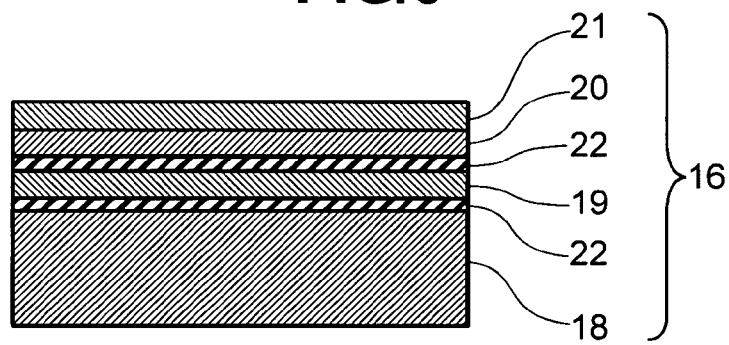
FIG. 6 is a cross-section view for showing the structure of a flexible film or sheet, which is applied into the united structure of tank/heat-radiator shown in FIG. 3 mentioned above.

By the way, the flexible film or sheet 16 mentioned above is obtained from a flexible film or sheet having plural numbers of characteristics, being formed into the laminated structure through adhesives 22, respectively, and hereinafter, explanation will be given on the respective films or sheets, by referring to the enlarged cross-section view of FIG. 6, which shows the flexible films and sheets for building up the unified structure of the tank/heat-radiator.

A reference numeral 18 depicts a first film or sheet, defining the most inner-side surface of the film or sheet, having the flexibility, and bonding or jointing thereof can be achieved with certainty, through conducting the heat welding on the outer periphery portions of the substrate 15, or on the respective surfaces of the partitioning portions thereof, along the flow passage, when bonding the film or sheet 16 made of thermoplastic resin material, having the flexibility, onto the substrate 15. The outer periphery portions of the substrate 15 is near to a plane in the form thereof, as is shown in FIGS. 3 and 4, having no edge portion, thereby causing the triple point on the films or sheets to be welded to; therefore, it can be said that it is the preferable structure to be applied with the heat welding therein.

A reference numeral 19 depicts a second film or sheet to be laminated on the upper surface of the first film or sheet 18, and it is made from, by using a material, showing impermeability against a liquid (i.e., being liquid-impermeable), for example, at least either one of a metal or an inorganic oxide; therefore, it prevents a gaseous component of the refrigerant from releasing or leaking into an outside, during a long-time period of use thereof, as well as, preventing the refrigerant from being reduced in an amount thereof and changing in the ratio of compound ingredients, thereby obtaining the heat-radiator of high reliability.

A reference numeral 20 depicts a third sheet pile up or laminated upon the upper surface of the first film or sheet 18, and it is made of a material, which brings about no chemical reaction onto the refrigerant (i.e., non-reactivity) when the refrigerant is filled up within the flow passage for refrigerant.

With this, the refrigerant can be protected from the chemical change and/or change of quality upon the contacting surface between the refrigerant, within an inside of the flow passage, thereby achieving the tank and the heat-radiator of high reliability, as well as, protecting the refrigerant from the chemical change and/or change of quality thereof.

A reference numeral 21 depicts a forth film or sheet, which is laminated on the upper surface of the first film or sheet, so as to define the most outer-side surface, and it is made of a material having elasticity, thereby releasing from an external force and/or mitigating injury or damages given thereupon, in a case where the external force is applied from an outside on the surface of the heat-radiator, and in particular, when manufacturing the heat-radiator and/or attaching it onto an equipment.

The flexible film or sheet 16 is made from such the flexible films and sheets, having such the plural numbers of characteristics, as were mentioned above, however, an arrangement and/or a presence of each the film or sheet in the lamination thereof should not be limited to the such mentioned above.

Further, the flexible film or sheet 16 may be formed from a metal film or sheet (a thin metal and softened). In such the case, it may be bonded or jointed onto the substrate 15.

Figure 5:
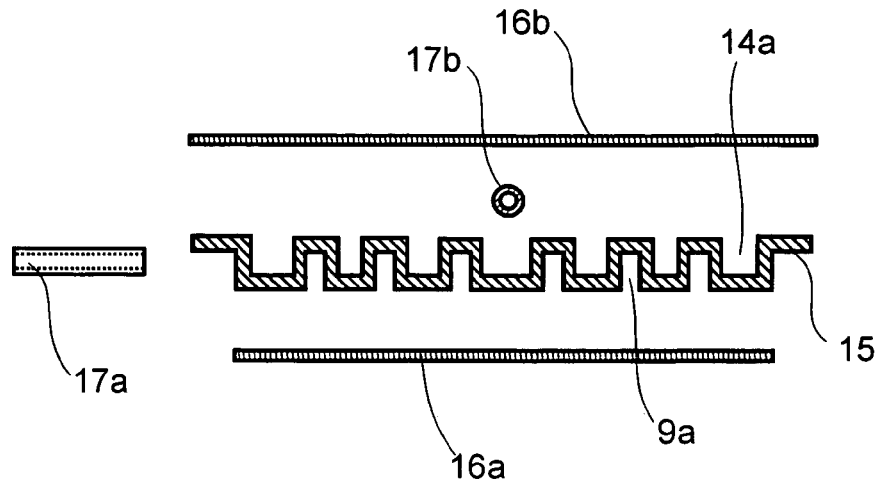
FIG. 5 is a view for showing a method for assembling the unified structure of tank/heat-radiator shown in FIG. 3 mentioned above.

Next, explanation will be given about a method for assembling the unified structure of the tank/heat-radiator, according to the present invention, by referring to FIG. 5. First of all, through the extrusion forming, for example, the recess portions 14a are formed, for building up the tank 14 on an upper side thereof, while forming the recess portions 9a for defining the heat-radiation flow passage 9 on a lower side thereof, thereby preparing the substrate 15, having the superior heat-conductivity and the superior heat-resistance, and being formed to be in a shape of about plane-like, on the outer periphery portion thereof. Next, the inlet portion 17a and the outlet portion 17b for refrigerant are connected with the inlet 9b of the heat-radiation flow passage or an inside of the tank 14, on the side surface or the bottom surface of the substrate 15 mentioned above, through brazing, welding, or adhesion, etc., for example. Next, the substrate 15 and the flexible films or sheets 16a and 16b, which are disposed on both sides of the said substrate, are connected through the heat-welding, with certainty, by utilizing the thermal plasticity of those flexible films or sheets 16a and 16b, in particular, of the film or sheet 16a upon the entire surface on the bottom surface of the substrate, and the film or sheet 16b upon at least on the outer periphery portions of the substrate 15; thereby, accomplishing the unified structure of the tank (i.e., the second heat-radiation body) and the heat radiator (i.e., the first heat radiation body), into which the refrigerant is enclosed. In this instance, the outer periphery portions of the substrate 15 is near to the plane-like, but having no edge portion; therefore, it causes no such the triple point on the films or sheets to be welded, thereby generating no welding defect, and then it is possible to prevent the refrigerant from leakage thereof. Accordingly, such the unified structure of the tank/heat-radiator can be said that it is the preferable structure for applying the heat welding therein.

Figure 7:
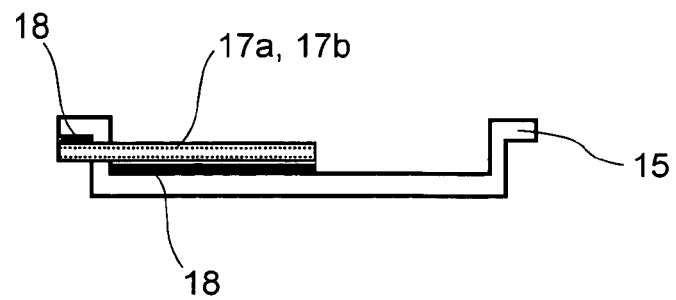
FIG. 7 is a view for showing a connecting structure of an inlet portion and an outlet portion for refrigerant, in particular, in the unified structure of tank/heat-radiator shown in FIG. 3 mentioned above.
Figure 8:
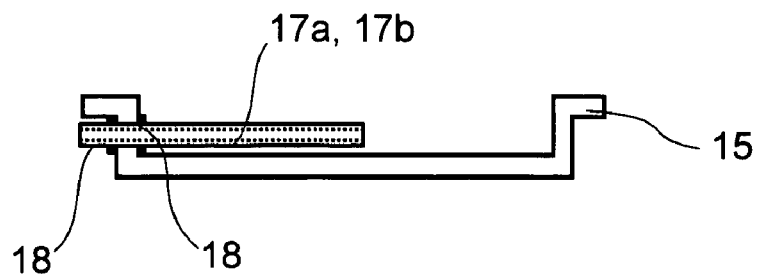
FIG. 8 is a view for showing other connecting structure of the inlet portion and the outlet portion for refrigerant, in the unified structure of tank/heat-radiator shown in FIG. 3 mentioned above.

With such the structure of brazing the pipe, for example, in the inlet portion 17a and the outlet portion 17b for refrigerant, as is shown in FIG. 7, the contact portions between the substrate 15 and the inlet portion 17a and also the outlet portion 17b of the refrigerant are sealed up with a brazing material 18. Also, as shown in FIG. 8, the bottom surface or a flange portion of the substrate 15 and the side surface of the pipe of the inlet portion 17a or the outlet portion 17b of the refrigerant are in contact with, and are brazed with using the brazing material 18, thereby improving the sealing strength therebetween. Other than the brazing, the connection may be achieved through the welding or adhesion, in the place thereof.

Figure 9:
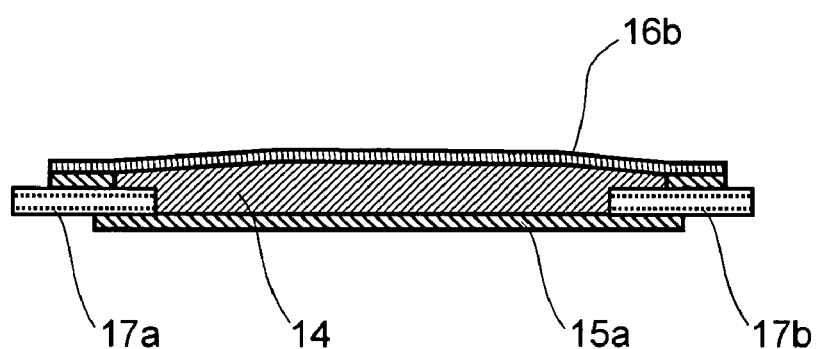
FIG. 9 is a cross-section view for showing the single structure of a tank, according to one of the embodiments of the present invention.

Next, explanation will be made about a single structure of a tank, according to an embodiment of the present invention, by referring to FIG. 9. Thus, the inlet portion 17a and the outlet portion 17b for the refrigerant are connected onto a substrate 15a, being attached with a flange on the outer periphery portion and formed with a recess for building up a tank at the central potion thereof, through the brazing or the like. And, onto the flange on the outer periphery portion of the substrate 15a is connected the flexible film or sheet 16b through the heat welding, etc., thereby enabling to manufacture such the tank single structure. The flexible film or sheet 16b may be formed from a metal film or sheet (a thin metal and softened).

Figure 10:
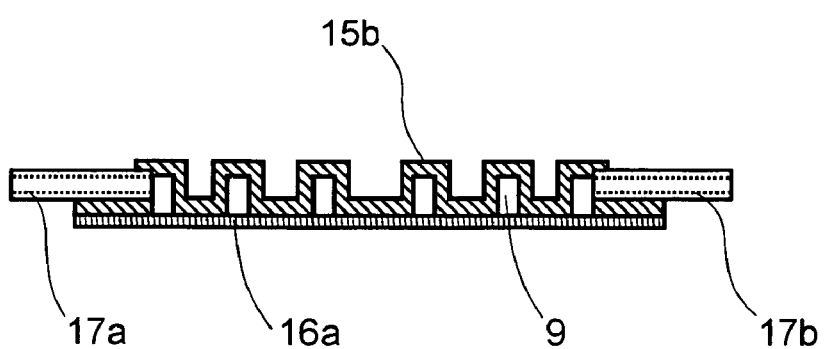
FIG. 10 is a cross-section view for showing the single structure of a heat-radiator, according to other one of the embodiments of the present invention.

Next, also explanation will be made about the tank single structure, according to the embodiment of the present invention, but by referring to FIG. 10 attached herein. Thus, fist of all, the substrate 15b is prepared, on which the recess portion 9a is formed for building up the heat-radiation flow passage 9 in a lower side thereof, through the extrusion forming, for example. However, the neighboring heat-radiation flow passages 9 are connected to each other, but so as to lie in a zigzag manner at the both end portions thereof. And, the inlet portion 17a and the outlet portion 17b for refrigerant are connected with, through the brazing, etc. Next, on the bottom surface of the substrate 15b is connected the flexible film or sheet 16a through the heat welding or the like, thereby enabling to manufacture such the single structure of heat-radiator. The flexible film or sheet 16a may be formed from a metal film or sheet (a thin metal and softened).

The tank structure of a single body (also having the second heat-radiation structure) and the heat-radiation structure (being the first heat-radiation structure), which were explained in the above, since they differ from each other only on a fact of whether a partition plate is provided or not, within the inside thereof; therefore, hereinafter, explanation will be made about the tank structure, as a representative one of the other embodiments.

Figure 11:
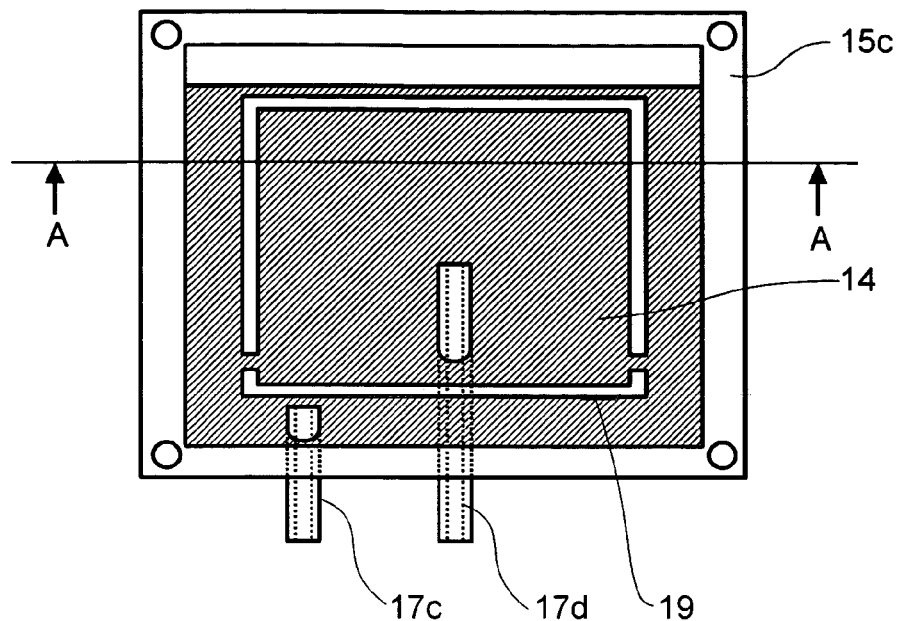
FIG. 11 is a front view for showing the single structure of tank and the single structure of heat-radiator, according to further other embodiment of the present invention.
Figure 12:
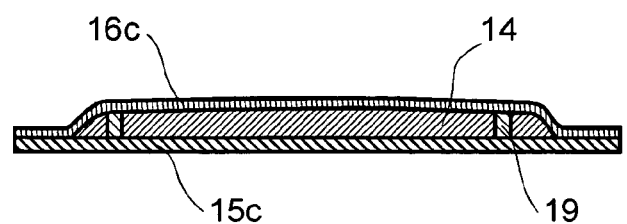
FIG. 12 shows the cross-section thereof, being cut along with a line indicated by arrows A-A in FIG. 11 mentioned above.
Figure 13:
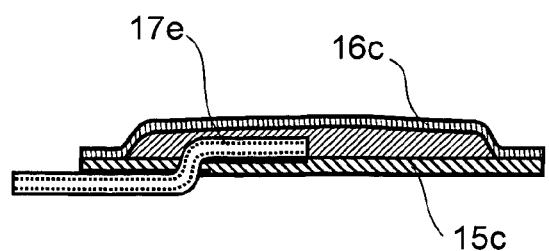
FIG. 13 is a view for showing the joint structure of an inlet portion and an outlet portion for refrigerant, which are applied into the further other embodiment of the single structure of tank and the single structure of heat-radiator, shown in FIGS. 11 and 12 mentioned above.
Figure 14:
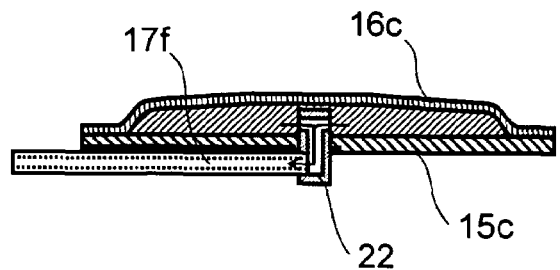
FIG. 14 is a view for showing further other joint structure of the inlet portion and the outlet portion for refrigerant, which are applied into the other embodiment of the single structure of tank and the single structure of heat-radiator, shown in FIGS. 11 and 12 mentioned above.

As other embodiment, FIG. 11 shows a front view of the tank single structure, in a case where a flexible film or sheet 16c is bonded or jointed on a flat substrate 15c, having no recess portion around the periphery thereof, while plumping or rising up the central portion of the flexible film or sheet, and FIG. 12 shows the cross-section view cut along a line indicated by arrows A-A in FIG. 11. Also, on this tank single structure, there are provided an inlet portion 17c for letting the refrigerant to flow into from a lower portion, and an outlet portion 17d for letting the refrigerant to flow out from the central portion of the tank. In this instance, there can be considered a case where the tank configuration expands downwards due to it's own weight under the condition that the tank is supplied with the refrigerant therein; therefore, a flame 19 is inserted within the tank for keeping up the shape thereof. And an inner side and an outer side of this shape keeping flame 19 within the tank are connected through a flow passage. In this manner, i.e., connecting the outlet portion 17d of refrigerant to the tank 14, at the central portion in the vertical direction and the horizontal direction thereof, it enables to prevent an air from flowing out from the outlet portion 17d, even if the air enters into the tank. Further, in FIGS. 13 and 14 are shown the embodiments having the structure, in which the inlet portion 17c and the outlet portion 17d for refrigerant are provided onto the flat substrate 15c. In the structure shown in FIG. 13, there are provided the inlet portion 17c and the outlet portion 17d on the flat substrate 15c, by brazing a pipe 17e, which is formed in "S" shape. Also, in FIG. 14, a pipe 17f is connected with in an inside of the tank, through an elbow joint 22, thereby achieving the small sizing and also brazing thereof with ease.

Figure 15:
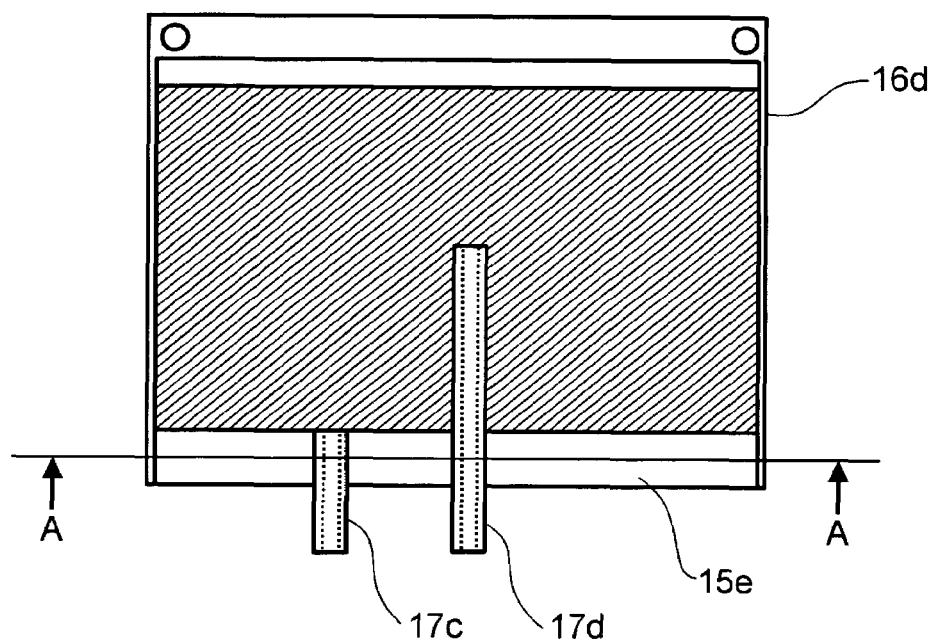
FIG. 15 is a front view for showing the single structure of tank and the single structure of heat-radiator, according to further other embodiment of the present invention.
Figure 16:
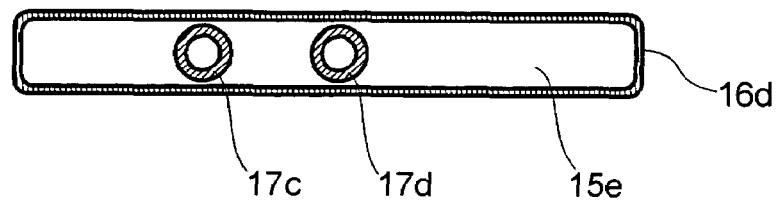
FIG. 16 shows the cross-section thereof, being cut along with a line indicated by arrows A-A in FIG. 15 mentioned above.

As further other embodiment, a front view of the tank single body is shown in FIG. 15, being built up with bonding or jointing a bag-like flexible film or sheet 16d onto a block substrate 15e, which has no recess portion; thereby, showing high sealing property thereof. And, FIG. 16 shows the cross-section view cut along a line indicated by arrows A-A in FIG. 15. In this case, the flexible film or sheet 16d is bag-like in the form, and the heat-welded portion is limited only onto an upper periphery portion, which is shown in the figure. Comparing to the structure of brazing the pipe of making up the inlet portion 17c and the outlet portion 17d for refrigerant shown in FIGS. 13 and 14, it is possible to maintain an area to be wide for brazing the pipe thereon; therefore, it can be said that this is preferable structure from a viewpoint of reliability thereof.

Figure 17:
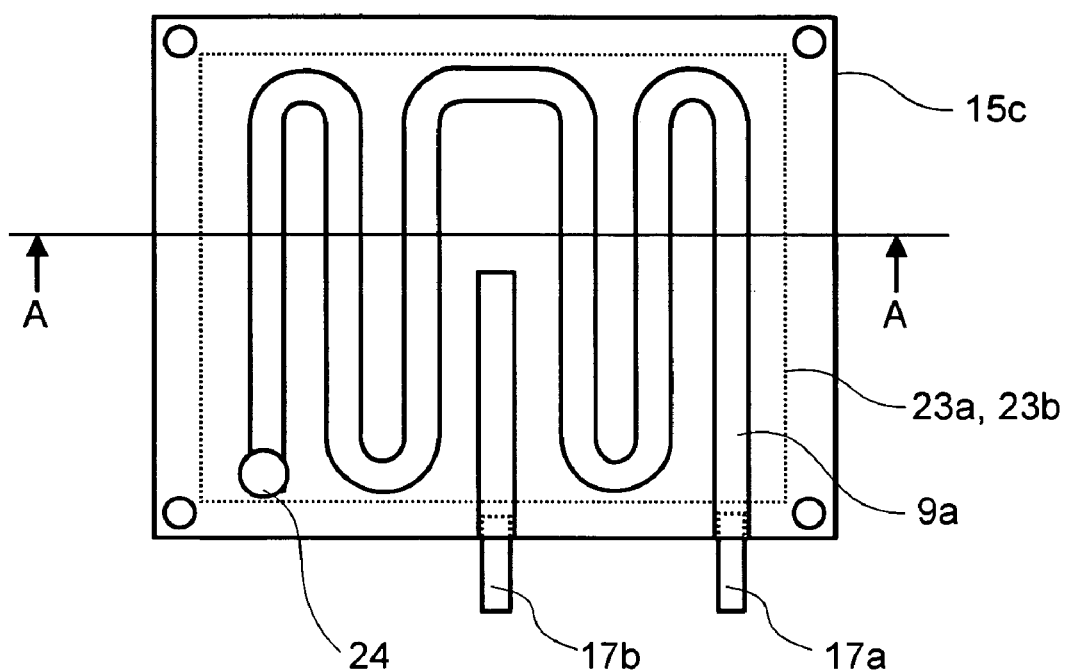
FIG. 17 is a front view for showing the unified structure of tank/heat-radiator, being jointed with using the roll-bond method, according to a first embodiment of the present invention.
Figure 18:
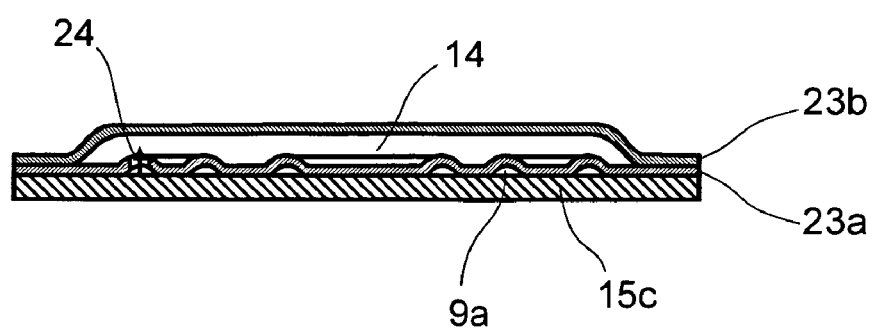
FIG. 18 shows the cross-section thereof, being cut along with a line indicated by arrows A-A in FIG. 17 mentioned above.

Next, explanation will be made on the unified-structures of tank/heat-radiator, according to further other embodiments of the present invention, each of which is built up with laminating or piling up the tank and the heat-radiator thereon, through the roll-bond method. FIG. 17 is a front view for showing a first embodiment obtained through the roll-bond method. And, FIG. 18 shows the cross-section view cut along a line indicated by arrows A-A in FIG. 17. In the first embodiment obtained through the roll-bond method, upon one of the surfaces of the plate-like substrate 15c having superior heat-conductivity and heat-resistance, there is formed a heat-radiator having a heat radiation flow passage 9a, which is formed to be semi-circular or semi-ellipse in the cross-section shape thereof, through a sheet having superior heat-conductivity and heat-resistance (such as, a metal thin sheet of Cu or Al, etc.), and further, piling up upon the upper surface of the heat-radiator on the same surface thereof, there is formed a sheet 23b having superior heat-conductivity and heat-resistance (such as, a metal thin sheet of Cu or Al, etc.), thereby to build up the tank 14. Further, the heat-radiation flow passages 9a neighboring to each other are connected with each other, alternately, at the both end portions thereof, so as to form a zigzag shape. Herein, within such the structure of the tank, it is possible to joint or bond the substrate 15c only around the periphery portions thereof, or for improving the joint or bonding structure thereof, to joint or bond only at a point, on a line or an area, arbitrarily, on the substrate 15c. Or alternatively, for achieving thin-sizing of the heat-radiator, if boding is made only on the flow passage 9a of heat-radiator upon the first layer thereof, then the flow passage (i.e., the tank) 14 formed on the second layer will not overlap the heat-radiation flow passage 9a over the first layer; therefore, it can be said to be an effective means, in particular, for achieving the thin-sizing thereof, as well as, light-weight thereof. Also, in a case where the tank structure is made up through the roll-bond method, after opening a penetration hole 24 on a sheet 23a between the first layer and the second layer, there is no need of a connection pile lying from the heat-radiator to the tank; therefore, it is advantageous structure from a viewpoint of cost and/or pressure-tight reliability thereof.

Figure 19:
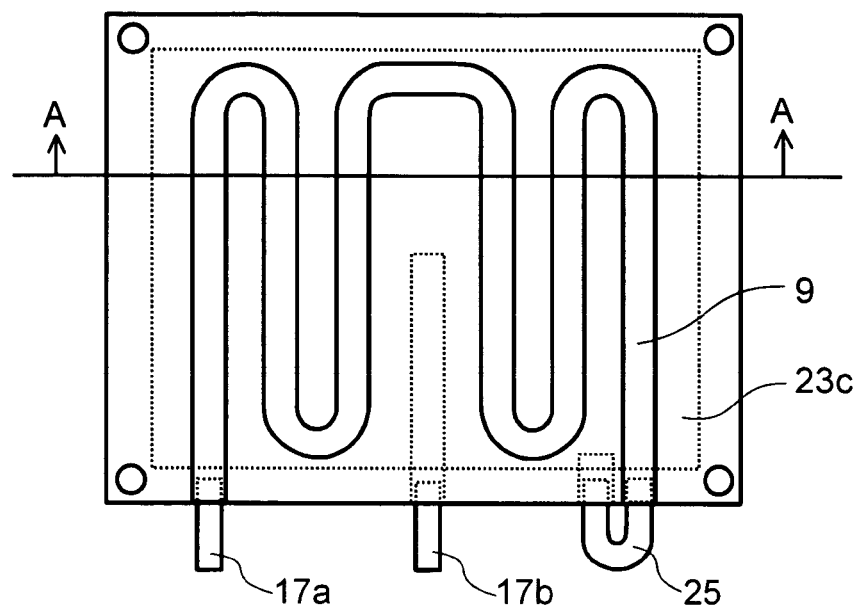
FIG. 19 is a front view for showing the unified structure of tank/heat-radiator, being jointed with using the roll-bond method, according to a second embodiment of the present invention.
Figure 20:
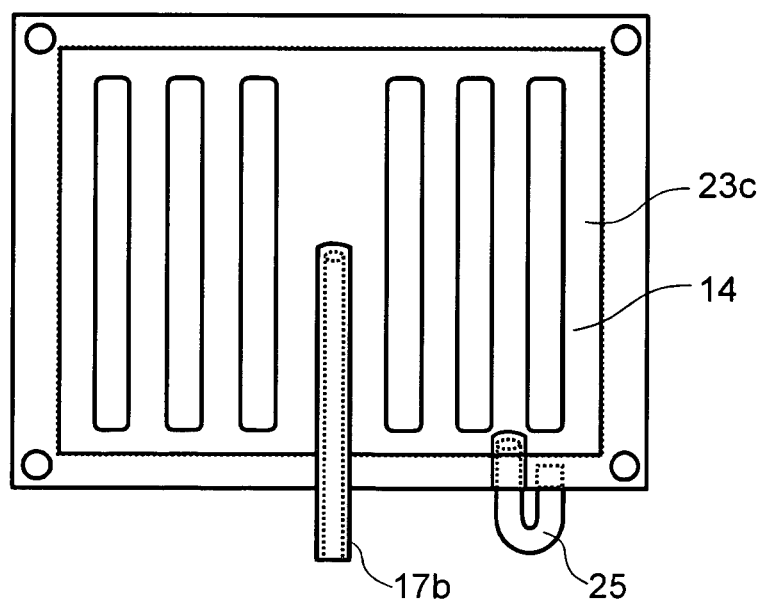
FIG. 20 shows the reverse-side view of that shown in FIG. 19.
Figure 21:
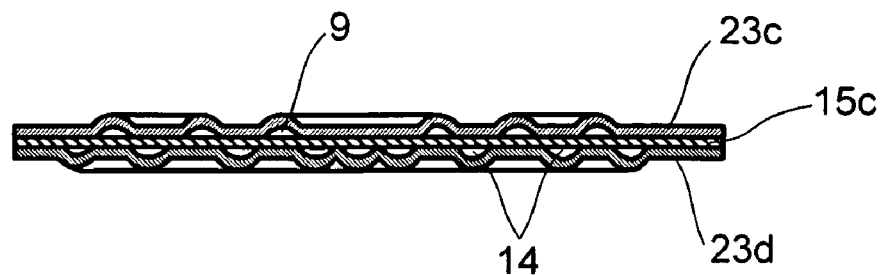
FIG. 21 shows the cross-section thereof, being cut along with a line indicated by arrows A-A in FIG. 19 mentioned above.

As a second embodiment obtained through the roll-bond method, there can be considered such ones, as shown in FIGS. 19 to 21. Thus, FIG. 19 is a front view of the second embodiment, FIG. 20 a revere-side view of the second embodiment, and FIG. 21 is a cross-section view cut along a line indicated by arrows A-A in FIG. 19. In the second embodiment obtained through the roll-bond method, upon one of the surfaces of the plate-like substrate 15c having superior heat-conductivity and heat-resistance, there is also formed a heat-radiator having a heat radiation flow passage 9a, being formed semi-circular or semi-ellipse in the cross-section shape thereof, for example, through a sheet having superior heat-conductivity and heat-resistance (such as, a metal thin sheet of Cu or Al, etc.), and further on the reverse-side surface of the substrate 15c, there is formed the tank 14 through a sheet 23d having superior heat-conductivity and heat-resistance (such as, a metal thin sheet of Cu or Al, etc.) Further, the heat-radiation flow passages 9a neighboring to each other are connected with each other, alternately, at the both end portion thereof, so as to form a zigzag form. Also, six (6) pieces of oblong portions, which are shown by solid lines in FIG. 21, and an outer periphery portion on the sheet 23d are pressured and jointed onto the plate-like substrate 15c through the roll-bond method, thereby building up the tank 14 with the portions other than those. Further, a connection is made between the an terminal end of the heat-radiation flow passage 9 formed on one-side surface and the tank 14 formed on the reverse-side surface thereof, through a conduit (i.e., a low passage) 25. Moreover, at an initial end of the heat-radiation flow passage 9 is connected the inlet portion 17a of refrigerant, and at the central portion of the tank 14, in the vertical direction and the horizontal direction thereof, are connected the outlet portion 17b of refrigerant.

Figure 22:
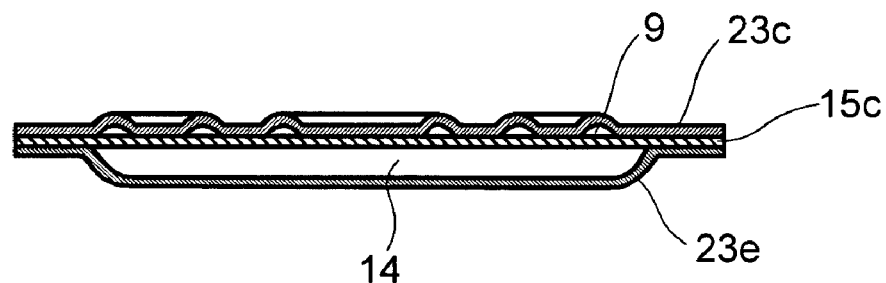
FIG. 22 is a side cross-section view for showing the unified structure of tank/heat-radiator, being jointed with using the roll-bond method, according to a third embodiment of the present invention.

In a third embodiment shown in FIG. 22, differing from the second embodiment shown in FIGS. 19 to 21 in the above, a sheet 23e has a central portion projecting out, so as to build up the tank 14, and it is pressed onto the plate-like substrate 15c, to be bonded around the periphery portion thereof, through the roll-bond method.

Figure 23:
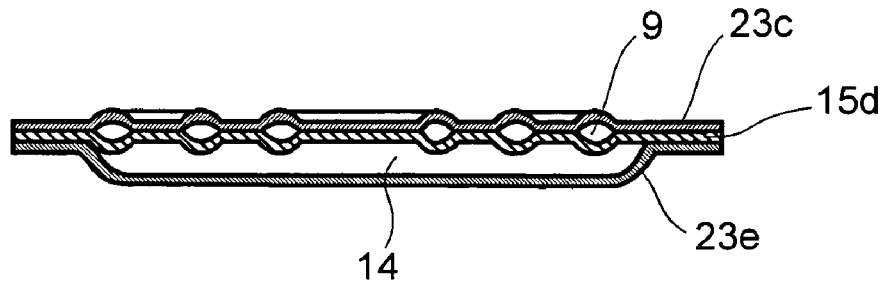
FIG. 23 is a side cross-section view for showing the unified structure of tank/heat-radiator, being jointed with using the roll-bond method, according to a fourth embodiment of the present invention.

Further, in a fourth embodiment shown in FIG. 23, differing from the third embodiment shown in FIG. 22 in the above, so as to bring the heat-radiation flow passage 9 to be pipe-like in the shape thereof, the plastic process is treated onto the substrate 15d, in the similar manner to the sheet 23c, thereby to form a portion, being semi-circular or semi-ellipse portion in the cross-section thereof.

As was fully mentioned in the above, according to those embodiments of the present invention, within the liquid cooling system circulating the refrigerant between the heat-receiving jacket, which is thermally connected with the heat-generation element and the heat-radiator, it is possible to achieve the thin-sizing of the heat-radiator and/or the tank, as well as, lowing the cost and high reliability thereof.

The present invention may be embodied in other specific forms without departing from the spirit or essential feature or characteristics thereof. The present embodiment(s) is/are therefore to be considered in all respects as illustrative and not restrictive, the scope of the invention being indicated by the appended claims rather than by the forgoing description and range of equivalency of the claims are therefore to be embraces therein.

What is claimed is:

1. A liquid cooling system, comprising:
   a heat-receiving jacket for flowing a refrigerant therein;
   a substrate having a recess structure on both first and second surfaces of said substrate;
   a first flexible film, which is joined with said recess structure of said first surface of said substrate so as to delimit a zigzag heat-radiation flow passage;
   a second flexible film, which is joined with said recess structure of said second surface of said substrate;
   a heat-radiation plate for radiating heat, being in contact with said first flexible film; and
   a liquid transfer means for generating a circulation flow of the refrigerant;
   wherein a tank for accumulating the refrigerant is delimited between said recess structure of said second surface of said substrate and said second flexible film; and
   wherein an inlet of said zigzag heat-radiation flow passage and an outlet of said zigzag heat-radiation flow passage have a respective tube connected thereat, and said outlet of said zigzag heat-radiation flow passage is connected to said tank, and an outlet of said tank is connected to an inlet of said heat-receiving jacket through another tube;
   wherein the circulation flow of the refrigerant is generated in an order of said heat-receiving jacket, said zigzag heat radiation flow passage, said tank, and said heat-receiving jacket; and
   wherein recesses of said recess structure of said first surface of said substrate and recesses said recess structure of said second surface of said substrate are formed alternately on said first and second surfaces of said substrate so that said recesses of said first surface are offset with respect to said recesses of said second surface.

2. The liquid cooling system, as described in claim 1, wherein said recesses of said first surface delimit a part of said zigzag heat-radiation flow passage and said recesses of said second surface delimit part of said tank.

\* \* \* \* \*